United States Patent [19]
Hashiguchi

[11] Patent Number: 5,892,385
[45] Date of Patent: Apr. 6, 1999

[54] LEVEL CONVERSION CIRCUIT CONTROLLED BY CLOCK SIGNAL

[75] Inventor: Akihiko Hashiguchi, Kanagawa, Japan

[73] Assignee: Sony Corporation, Japan

[21] Appl. No.: 749,783

[22] Filed: Nov. 15, 1996

[30] Foreign Application Priority Data

Nov. 21, 1995 [JP] Japan ................................... 7-303182

[51] Int. Cl.⁶ ............................................ H03K 19/0175
[52] U.S. Cl. ......................... 327/333; 327/211; 327/208; 326/81; 326/68
[58] Field of Search ............................. 327/99, 333, 437, 327/199, 201, 208, 210, 306, 211, 100; 336/68, 80, 81, 83, 62, 63

[56] References Cited

U.S. PATENT DOCUMENTS

| | | | |
|---|---|---|---|
| 5,444,396 | 8/1995 | Sneda | 326/81 |
| 5,530,392 | 6/1996 | Runas et al. | 327/333 |

*Primary Examiner*—Dinh Le
*Attorney, Agent, or Firm*—Ronald P. Kananen; Rader, Fishman & Grauer

[57] ABSTRACT

In a level conversion circuit where the input signal is input via a flip-flop which sets its output in a high impedance state during the holding state, by adding a circuit which sets the output voltage to a predetermined potential level when the output of the flip-flop is in a high impedance state, the leakage current is reduced and a clock skew is prevented, to result in a stable operation of the level conversion circuit.

7 Claims, 10 Drawing Sheets

FIG. 3A  Tck
FIG. 3B  Tck1
FIG. 3C  ND0
FIG. 3D  ND1
FIG. 3E  Tout

LEVEL CONVERSION CIRCUIT CONTROLLED BY CLOCK SIGNAL

BACKGROUND OF THE INVENTION

1. Field of the Invention

The present invention relates to a level conversion circuit for converting a signal level of a first circuit to another signal level of a second circuit having a different power supply voltage from that of the first circuit.

2. Background of the Invention

In recent LSIs, different power supply voltages such as 5V, 3.3V, and 2.2V are used. Further, efforts have been made to lower the power supply voltage for reduction of power consumption, but when considering the margin of the voltage, the operating speed of the circuit, etc., there are known circuits where the power supply voltage cannot be lowered. For this reason, level conversion circuits are used as an interface between different circuit blocks having different power supply voltages or an interface between different LSIs.

According to the operating mode, level conversion circuits are roughly categorized into two types: asynchronous level conversion circuits and synchronous level conversion circuits.

In an asynchronous level conversion circuit wherein a clock signal is not used, a leakage current generally flows between power sources having different voltages during a level converting operation. Further, in a synchronous level conversion circuit wherein a clock signal is used for a synchronized operation, the disadvantages peculiar to asynchronous circuits can be overcome, but malfunctions tend to occur due to the time lag of the clock signal.

SUMMARY OF THE INVENTION

An object of the present invention is to provide a level conversion circuit in which by reducing the leakage current, not only can the power consumption be reduced, but also malfunctions can be avoided and a high operation speed can be achieved.

To achieve the above object, the present invention provides a synchronous type level conversion circuit controlled in operation timing by a clock signal, comprising a first circuit transferring to an output node an input signal which complementarily becomes a first power source potential level or a reference potential level and setting the output node in a high impedance state, a second circuit outputting a signal of a second power source potential level or the reference potential level in response to the level of the output node of the first circuit and the level of the clock signal, and a third circuit setting the output node of the first circuit at a predetermined potential level when the output node of the first circuit is in a high impedance state.

Further, in the present invention, the second circuit holds the level of the output signal and sets the output impedance in a high state when the output of the first circuit is set in the high impedance state.

Further, in the present invention, the second circuit holds the output at a high impedance state when the output node of the first circuit is set in the high impedance state, outputs the signal of the reference potential level when the level of the output node of the first circuit is set in the reference potential level and outputs the second power supply potential level when the output node of the first circuit is set in the first power supply potential level. The third circuit sets the signal level of the output node of the first circuit in the reference potential level when the output impedance of the first circuit is set in the high state.

According to the present invention, there is provided a so-called synchronous level conversion circuit where the operation timing of the level conversion circuit is controlled by a clock signal and, for example, at the rising edge of the clock signal, the signal input to the input terminal of the first circuit is transferred to the output node of the first circuit, and the output signal level of the second circuit is controlled in accordance with the signal level of the output node of the first circuit.

The signal of the reference potential level is output by the second circuit when the output node of the first circuit is at a high level, and a signal of the second power supply potential level is output by the second circuit when the output node of the first circuit is at the low level.

Further, at the falling edge of the clock signal, the output of the first circuit is set in at a high impedance state, and the output node of the first circuit is held at the fixed potential, for example, the reference potential by the third circuit connected to the output node of the first circuit. At this time, a signal of the second power supply potential level is output by the second circuit.

BRIEF DESCRIPTION OF THE DRAWINGS

The above and other objects and features of the present invention will be described in more detail with reference to the accompanying drawings, in which.

DESCRIPTION OF THE PREFERRED EMBODIMENTS

Figure 1:
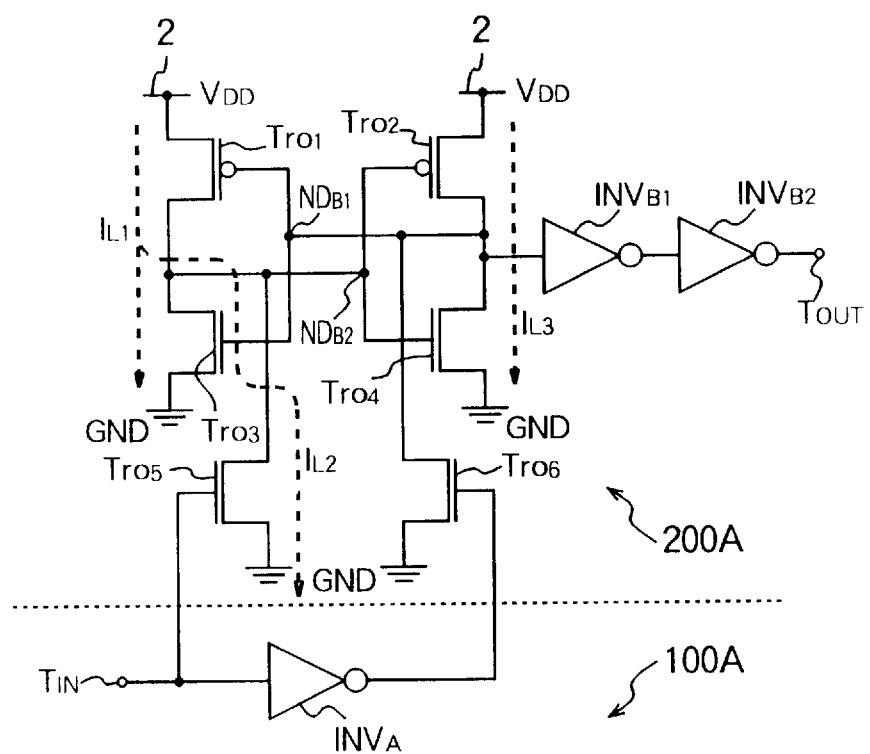
FIG. 1 is a circuit diagram of an example of an asynchronous type level conversion circuit.

FIG. 1 is a circuit diagram of an example of an asynchronous type level conversion circuit.

In FIG. 1, 100A denotes a first circuit operating at a power supply voltage $V_{cc}$ of, for example 2.2V; and 200A denotes a second circuit operating at a power supply voltage $V_{DD}$ of, for example, 3.3V.

$T_{r01}$ and $T_{r02}$ denote p-type MOS (hereinafter referred to as pMOS) transistors, $T_{r03}$, $T_{r04}$, $T_{r05}$, and $T_{r06}$ denote n-type MOS (hereinafter, referred to as nMOS) transistors, $INV_A$ denotes an inverter operating at a power supply voltage $V_{cc}$ of, for example 2.2V, and $INV_{B1}$ and $INV_{B2}$ denote inverters operating at a power supply voltage $V_{DD}$ of, for example, 3.3$V_0$.

As illustrated, an input terminal $T_{IN}$ is connected to the gate of the nMOS transistor $T_{r05}$ and further connected to the gate of the nMOS transistor $T_{r06}$ via the inverter $INV_A$.

The pMOS transistor $T_{r01}$ and nMOS transistor $T_{r03}$ and the pMOS transistor $T_{r02}$ and nMOS transistor $T_{r04}$ create inverters, respectively.

The gate of the pMOS transistor $T_{r01}$ and the gate of the nMOS transistor $T_{r03}$ are connected, a connection point node $ND_{B1}$ constitutes the input terminal of the inverter, the drains of the pMOS transistor $T_{r01}$ and pMOS transistor $T_{r03}$ are connected to each other, and the connection point thereof constitutes the output terminal of the inverter.

Further, the gate of the pMOS transistor $T_{r02}$ and the gate of the nMOS transistor $T_{r04}$ are connected, a connection point node $ND_{B2}$ constitutes the input terminal of the inverter, the drains of the pMOS transistor $T_{r02}$ and pMOS transistor $T_{r04}$ are connected to each other, and the connection point thereof constitutes the output terminal of the inverter.

The sources of the pMOS transistors $T_{r01}$ and $T_{r02}$ are connected to the supply line 2 of the power supply voltage $V_{DD}$. Each of the sources of the nMOS transistors $T_{r02}$ and $T_{r04}$ is grounded.

The output terminal of the inverter created by the pMOS transistor $T_{r01}$ and the nMOS transistor $T_{r03}$ is connected to the input terminal $ND_{B2}$ of the inverter created by the pMOS transistor $T_{r02}$ and the nMOS transistor $T_{r04}$, and further the drain of the nMOS transistor $T_{r05}$ is connected to the connecting point thereof.

The output terminal of the inverter created by the pMOS transistor $T_{r02}$ and the nMOS transistor $T_{r04}$ is connected to the input terminal $ND_{B1}$ of the inverter created by the pMOS transistor $T_{r01}$ and the nMOS transistor $T_{r03}$, and further the drain of the nMOS transistor $T_{r06}$ is connected to the connecting point thereof.

Each of the sources of the nMOS transistor $T_{r05}$ and the nMOS transistor $T_{r06}$ is grounded.

Further, the node $ND_{B1}$ is connected to the output terminal $T_{OUT}$ via the serially connected inverters $INV_{B1}$ and $INV_{B2}$.

Below, a brief explanation will be made of the operation of the asynchronous level conversion circuit of the above configuration.

When a high level signal such as, for example, a signal of 2.2V, is input to the input terminal $T_{IN}$, the nMOS transistor $T_{r05}$ becomes conductive and the nMOS transistor $T_{r06}$ becomes nonconductive. Due to this, the potential at the node $ND_{B2}$ is discharged via the nMOS transistor $T_{r05}$, and the potential is pulled down to the ground potential. As a result, the pMOS transistor $T_{r02}$ becomes conductive, the potential at the node $ND_{B1}$ is precharged via the pMOS transistor $T_{r02}$ in the conductive state, and the potential is pulled up to the power supply voltage $V_{DD}$.

Further, the high level potential of the node $ND_{B1}$, that is, a potential of 3.3V, is transferred via the inverters $INV_{B1}$ and $INV_{B2}$ to the output terminal $T_{OUT}$.

When a low level signal such as, for example, a signal of 0V, is input to the input terminal $T_{IN}$, the nMOS transistor $T_{r05}$ becomes nonconductive, and the nMOS transistor $T_{r06}$ becomes conductive. The potential at the node $ND_{B1}$ is discharged via the nMOS transistor $T_{r06}$, and the potential is pulled down to the ground potential. As a result, the pMOS transistor $T_{r01}$ becomes conductive, the potential at the node $ND_{B2}$ is precharged via the pMOS transistor $T_{r01}$ in the conductive state, and the potential is pulled up to the power supply voltage $V_{DD}$. As a result, the transistor $T_{r02}$ becomes nonconductive, the transistor $T_{r04}$ becomes conductive, and the low level of the node $ND_{B1}$ is stably held.

Further, the potential of the low level of the node $ND_{B1}$ is transferred via serially connected inverters $INV_{B1}$ and $INV_{B2}$ to the output terminal $T_{OUT}$.

The 2.2V signal input to the input terminal $T_{IN}$ of the first circuit 100A is converted to 3.3V by the operation as mentioned above. This is output to the output terminal $T_{OUT}$ of the second circuit 200A. Namely, the asynchronous level conversion circuit shown in FIG. 1 realizes the level conversion of the signal between different circuit blocks with different power supply voltages.

Figure 2:
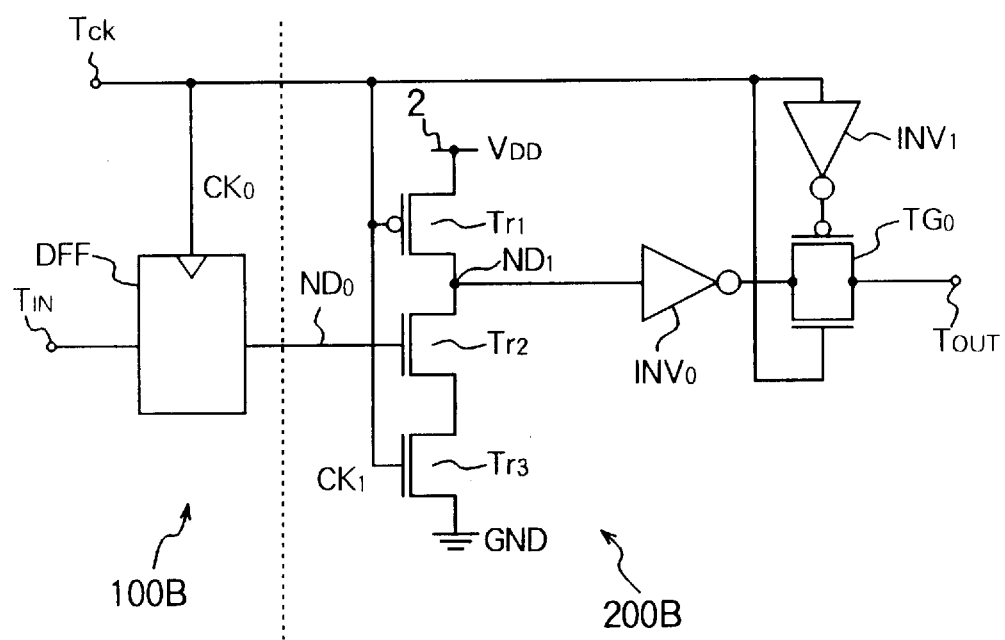
FIG. 2 is a circuit diagram of an example of a synchronous type level conversion circuit.
Figure 3:
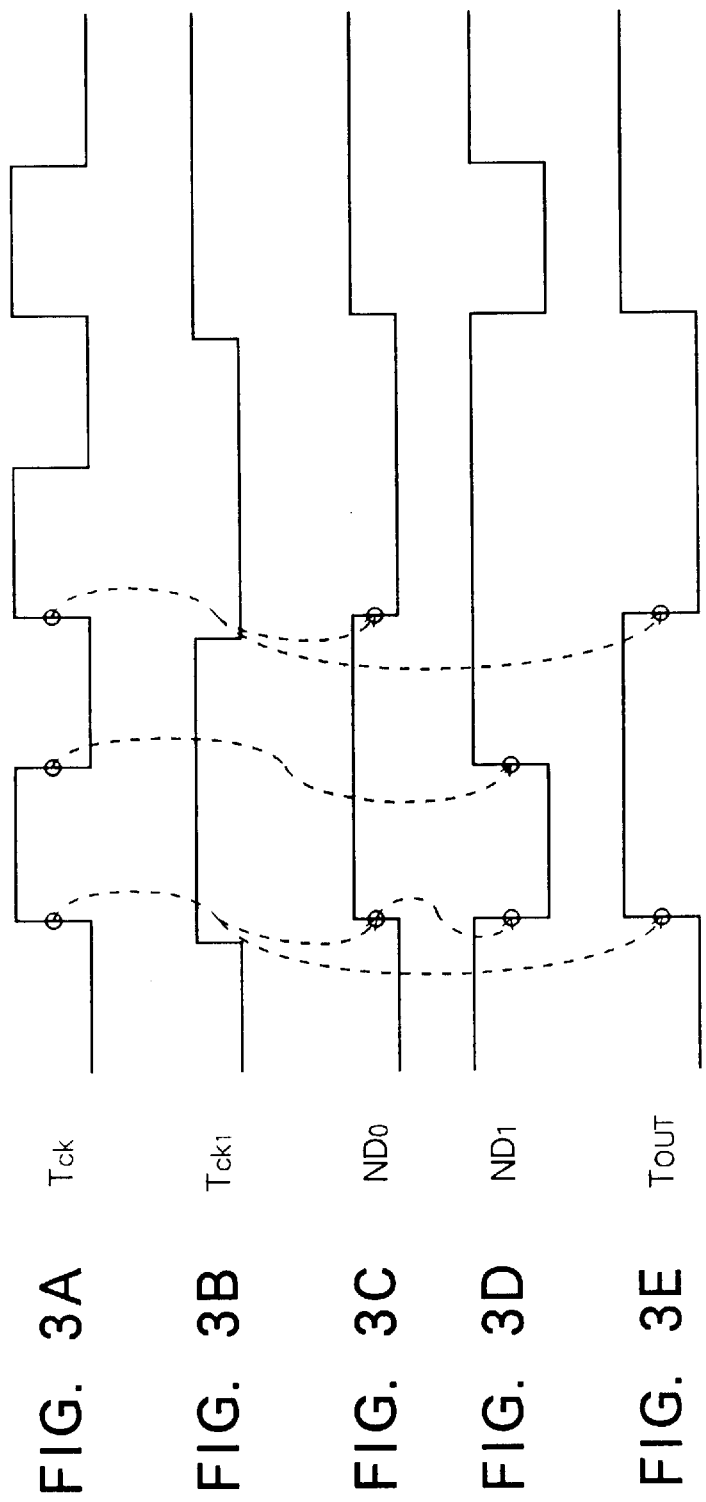
FIGS. 3A to 3E are timing charts of the operation of the level conversion circuit shown in FIG. 2.
Figure 4:
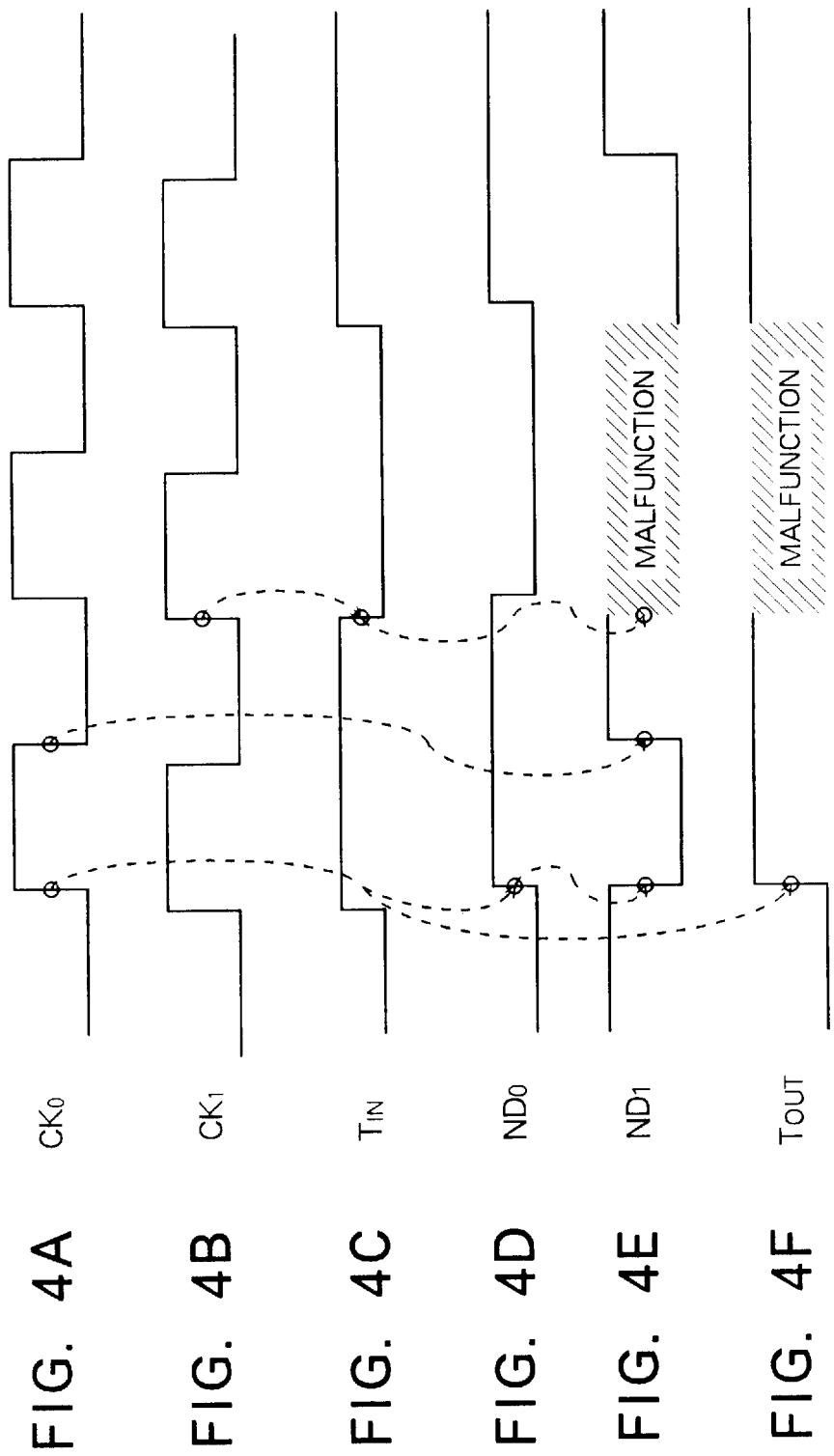
FIGS. 4A to 4F are timing charts of the operation of the level conversion circuit shown in FIG. 2 when a clock skew occurs.

FIG. 2 is a circuit diagram of an example of a synchronous level conversion circuit.

In FIG. 2, 100B denotes a first circuit operating at a power supply voltage $V_{cc}$ of, for example, 2.2V, and 200B denotes a second circuit operating at a power supply voltage $V_{DD}$ of, for example, 3.3V.

In FIG. 2, DFF denotes a D-type flip-flop operating at a power source voltage $V_{cc}$ of for example 2.2V, $T_{r1}$ denotes a pMOS transistor, $T_{r2}$ and $T_{r3}$ denote nMOS transistors, $INV_0$ and $INV_1$ are inverters operating at a power source voltage $V_{DD}$ of, for example, 3.3V, and $TG_0$ denotes a transfer gate comprising a pMOS transistor and an nMOS transistor with drains and sources connected to each other.

Further, $T_{IN}$ denotes an input terminal, $T_{OUT}$ denotes an output terminal, and $T_{CK}$ denotes an input terminal of the clock signal CK.

The clock input terminal $T_{CK0}$ of the D-type flip-flop DFF is connected to the input terminal $T_{CK}$ of the clock signal CK, and the signal input terminal is connected to the input terminal $T_{IN}$. The output terminal of the D-type flip-flop DFF is connected to the gate of the nMOS transistor $T_{r2}$, and the connecting point thereof constitutes the node $ND_0$.

The source of the pMOS transistor $T_{r1}$ is connected to the supply line 2 of the power source voltage $V_{DD}$, the drain is connected to the drain of the nMOS transistor $T_{r2}$, and the connecting point thereof constitutes the node $ND_1$. The source of the nMOS transistor $T_{r2}$ is connected to the drain of the nMOS transistor $T_{r3}$ and the source of the nMOS transistor $T_{r3}$ is grounded. Further, the gates of the pMOS transistor $T_{r1}$ and the nMOS transistor $T_{r3}$ are connected, and the connecting point thereof is connected to the input terminal $T_{CK}$ of the clock signal CK.

The input terminal of the inverter $INV_0$ is connected to the node $ND_1$, and the output terminal of the inverter $INV_0$ is connected to the output terminal $T_{OUT}$ via the transfer gate $TG_0$. Further, the gate of the pMOS transistor in the transfer gate $TG_0$ is connected to the input terminal $T_{CK}$ of the clock signal CK via the inverter $INV_1$, and the gate of the nMOS transistor in the transfer gate $TG_0$ is connected to the input terminal $T_{CK}$ of the clock signal CK.

Below, an explanation will be made of the operation of the synchronous level conversion circuit shown in FIG. 2 referring to the timing chart of FIGS. 3A to 3E.

A clock signal CK alternately taking a high level and low level at a predetermined cycle is input to the input terminal $T_{CK}$ for the clock signal CK. Another clock signal CK1 which is alternatedly and periodically changed to a different high level or low level, is input to the terminal $T_{IN}$.

Note that, the high level of the signal input to the input terminal $T_{IN}$ is the same as that of the power source voltage $V_{cc}$ of the first circuit 100B, for example, 2.2V. The high level of the clock signal CK1 input to the input terminal $T_{CK}$ is, for example, 3.3V and the same as the power source voltage $V_{DD}$ of the second circuit 200B. Further, the ground potential GND is set at 0V.

At the rising edge of the clock signal CK1, the signal input to the input terminal $T_{IN}$ is transferred to the node $ND_0$ by the D-type flip-flop DFF. When the clock signal CK1 is at a high level, the pMOS transistor $T_{r1}$ becomes nonconductive, and the nMOS transistor $T_{r3}$ becomes conductive.

At this time, where the signal at the node $ND_0$ is at a high level, the nMOS transistor $T_{r2}$ also becomes conductive, the potential at the node $ND_1$ is discharged via the nMOS transistors $T_{r2}$ and $T_{r3}$, and the potential is pulled down to the ground potential.

On the other hand, where the signal at the node $ND_0$ is at a low level, the nMOS transistor $T_{r2}$ becomes nonconductive, and where the clock signal CK1 is a high level, the pMOS transistor $T_{r1}$ becomes nonconductive, therefore the node $ND_1$ becomes the high impedance state, and the high level potential immediately before this is held.

At the falling edge of the clock signal CK1, the nMOS transistor $T_{r3}$ becomes nonconductive in state, the pMOS transistor $T_{r1}$ becomes conductive in state, and the potential at the node $ND_1$ is precharged via the pMOS transistor $T_{r1}$ and held at the level of the power source voltage $V_{DD}$.

Since the nMOS transistor $T_{r3}$ is nonconductive, during the period where the clock signal CK becomes the low level, the signal at the node $ND_1$ is held at the level of the power source voltage $V_{DD}$ irrespective of the level of the node $ND_0$.

Since the transfer gate $TG_0$ is held in the conductive state during the period where the clock signal CK is at the high level, the signal of the node $ND_1$ is inverted by the inverter $INV_0$ and is transferred via the transfer gate $TG_0$ to the output terminal $T_{OUT}$.

By the above operation, at the rising edge of the clock signal CK, the signal input to the input terminal $T_{IN}$ is transferred to the node $ND_0$ via the D-type flip-flop DFF and further inverted via the nMOS transistor $T_{r2}$ and output to the node $ND_1$. The signal of the node $ND_1$ is inverted by the inverter $INV_0$ during the period where the clock signal CK is at the high level and is transferred to the output terminal $T_{OUT}$ via the transfer gate $TG_0$.

As mentioned above, at the rising edge of the clock signal CK, a signal of, for example, 2.2V input to the input terminal $T_{IN}$ is converted in level to a signal of 3.3V and output to the output terminal $T_{OUT}$.

The level conversion circuits explained above suffer from several disadvantages. For example, in the asynchronous level conversion circuit shown in FIG. 1, at the rising and falling edges of the input signal, as shown in FIG. 1, leakage currents $I_{L1}$ to $I_{L3}$ as shown by dotted lines flow and the power consumption of the level conversion circuit consequently becomes large. Further, the circuit constant should be changed in accordance with the level of the voltage to be converted, making the design of the level conversion circuit is troublesome.

Further, in the synchronous level conversion circuit shown in FIG. 2, if a deviation occurs between the clock signal input terminal $T_{CK0}$ of the D-type flip-flop DFF and the clock signal input to the gate electrode $T_{CK1}$ of the nMOS transistor $T_{r3}$, it suffers from the disadvantage that the potential at the node $ND_1$ is discharged due to the signal from the previous cycle and a malfunction may occur.

Below, a more detailed explanation will be given of the malfunction of the synchronous level conversion circuit shown in FIG. 2, referring to the timing charts shown in FIGS. 4A to 4F.

A case where there is a deviation between the clock signal input to the clock signal input terminal of the D-type flip-flop DFF and the clock signal input to the gate electrode of the nMOS transistor $T_{r3}$ will be considered.

As illustrated in FIGS. 4A to 4F, the phase of the clock signal input to the gate electrode of the nMOS transistor $T_{r3}$ (clock signal $CK_1$) is slightly before that of the clock signal input to the clock signal input terminal of the D-type flip-flop DFF (hereinafter referred to as a clock signal $CK_0$).

In such a case, at the rising edge of the clock signal $CK_1$, the pMOS transistor $T_{r1}$ is switched to the nonconductive state and the nMOS transistor $T_{r3}$ is switched to the conductive state. Therefore, when the signal of the node $ND_0$ is at a high level, the nMOS transistor $T_{r2}$ becomes conductive, and the node $ND_1$ reaches a low level, that is, a signal having an inverse phase from that of the input signal appears at the node $ND_1$.

Further, when the signal of the node $ND_0$ is at a low level, the nMOS transistor $T_{r2}$ becomes nonconductive in state, the node $ND_1$ reaches a high impedance state, and the potential of the high level immediately before this time is held.

Then, at the rising edge of the clock signal $CK_0$, the signal input to the input terminal $T_{IN}$ is transferred via the D-type flip-flop DFF to the node $ND_0$.

As mentioned above, when a deviation occurs between the clock signal $CK_1$ and the clock signal $CK_0$, the potential at the node $ND_1$ is discharged due to the signal level of the previous cycle, the signal at the node $ND_1$ is not maintained at a normal signal level, and a malfunction may occur in the level conversion circuit.

First Embodiment

Figure 5:
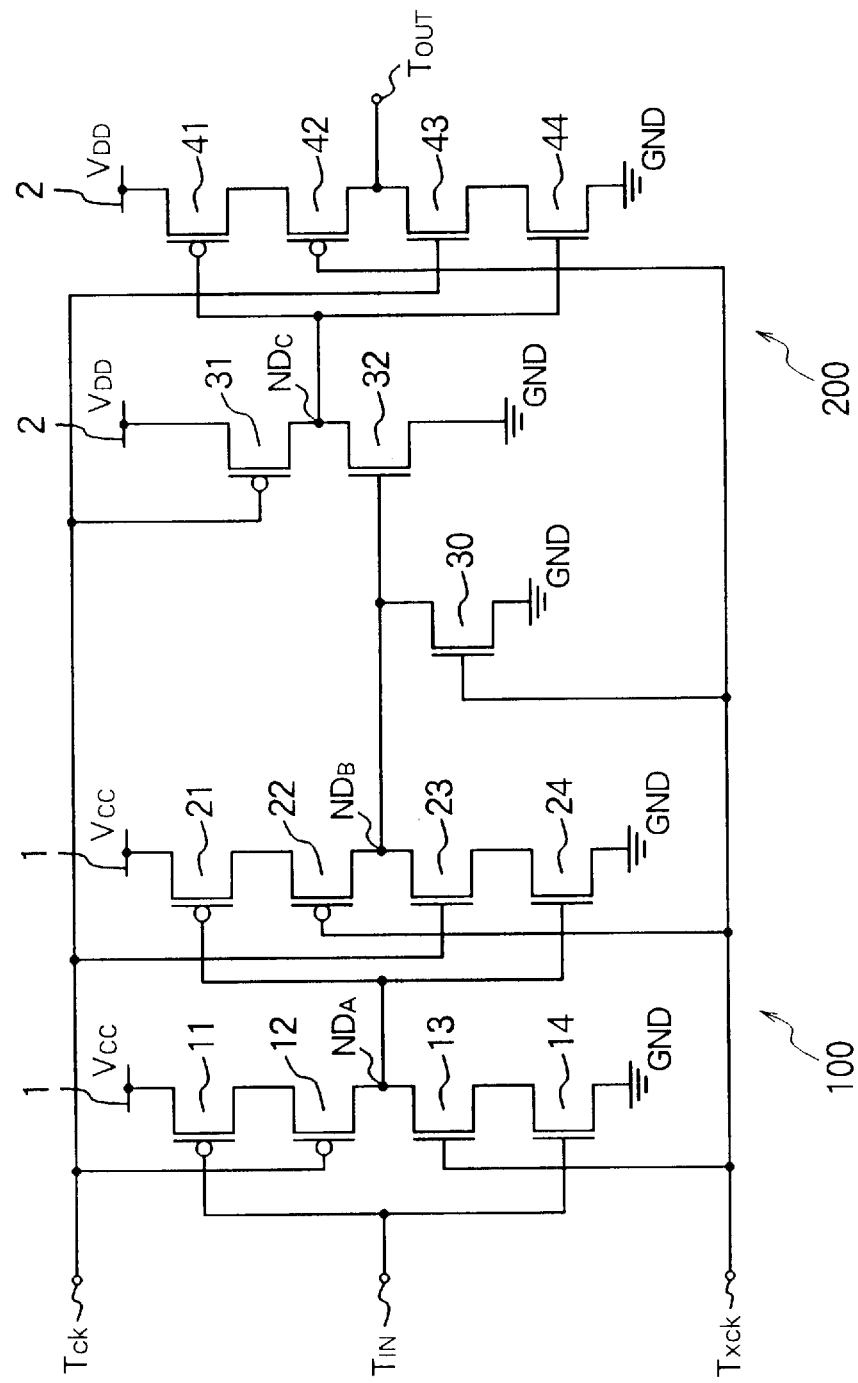
FIG. 5 is a circuit diagram of a first embodiment of the present invention.

FIG. 5 is a circuit diagram of a first embodiment of a level conversion circuit according to the present invention.

In FIG. 5, 100 denotes a first circuit operating at a power source voltage $V_{cc}$ of, for example, 2.2V, and 200 denotes a second circuit operating at a power source voltage $V_{DD}$ of, for example, 3.3V.

In FIG. 5, reference numerals 11, 12, 21, 22, 31, 41, and 42 denote pMOS transistors, 13, 14, 23, 24, 30, 32, 43, and 44 denote nMOS transistors, 1 denotes a supply line of the power source voltage $V_{cc}$, 2 denotes a supply line of the power source voltage $V_{DD}$, $T_{CK}$ an input terminal of the clock signal CK, $T_{XCK}$ an input terminal of the inverted signal of the clock signal CK, $T_{IN}$ an input terminal, $T_{OUT}$ an output terminal, and $ND_A$, $ND_B$, and $ND_C$ denote nodes, respectively.

The source of the pMOS transistor 11 is connected to the supply line 1 of the power source voltage $V_{cc}$, the drain of the pMOS transistor 11 and the source of the pMOS transistor 12 are connected together, the drain of the pMOS transistor 12 and the drain of the nMOS transistor 13 are connected together, the node $ND_A$ is created by the connecting point thereof, the source of the nMOS transistor 13 and the drain of the nMOS transistor 14 are connected, and the source of the nMOS transistor 14 is grounded.

The gate of the pMOS transistor 11 and the gate of the nMOS transistor 14 are connected together, the connecting point thereof is connected to the input terminal $T_{IN}$, the gate of the pMOS transistor 12 is connected to the input terminal $T_{CK}$ of the clock signal CK, and the gate of the nMOS transistor 13 is connected to the input terminal $T_{XCK}$ for the inverted signal of the clock signal CK.

The source of the pMOS transistor 21 is connected to the supply line 1 of the power source voltage $V_{cc}$, the drain of the pMOS transistor 21 and the source of the pMOS transistor 22 are connected, the drain of the pMOS transistor 22 and the drain of the nMOS transistor 23 are connected, the node $ND_B$ is created by the connecting point thereof, the source of the nMOS transistor 23 and the drain of the nMOS transistor 24 are connected together, and the source of the nMOS transistor 24 is grounded.

The gate of the pMOS transistor 21 and the gate of the nMOS transistor 24 are connected together, the connecting point thereof is connected to the node $ND_A$, the gate of the pMOS transistor 22 is connected to the input terminal $T_{XCK}$ for the inverted signal of the clock signal CK, and the gate of the nMOS transistor 23 is connected to the input terminal $T_{CK}$ for the clock signal CK.

The above elements constitute the first circuit 100 operating at the power source voltage $V_{cc}$.

Further, the gate of the nMOS transistor 30 of the third circuit is connected to the input terminal $T_{XCK}$ for the inverted signal of the clock signal CK, the drain of the nMOS transistor 30 is connected to the node $ND_B$, and the source is grounded.

Below, an explanation will be made of the configuration of the second circuit 200 operating at the power source voltage $V_{DD}$.

The source of the pMOS transistor 31 is connected to the supply line 2 of the power source voltage $V_{DD}$, the drain of the pMOS transistor 31 and the drain of the nMOS transistor 32 are connected, the node $ND_C$ is created by the connecting point thereof, and the source of the nMOS transistor 32 is grounded.

The gate of the pMOS transistor 31 is connected to the input terminal $T_{CK}$ of the clock signal CK, and the gate of the nMOS transistor 32 is connected to the node $ND_B$.

The source of the pMOS transistor 41 is connected to the supply line 2 of the power source voltage $V_{DD}$, the drain of the pMOS transistor 41 and the source of the pMOS transistor 42 are connected together, the drain of the pMOS transistor 42 and the drain of the nMOS transistor 43 are connected together, the connecting point thereof is connected to the output terminal $T_{OUT}$, the source of the nMOS transistor 43 is connected to the drain of the nMOS transistor 44, and the source of the nMOS transistor 44 is grounded.

The gate of the pMOS transistor 41 and the gate of the nMOS transistor 44 are connected together, the connecting point thereof is connected to the node $ND_C$, the gate of the pMOS transistor 42 is connected to the input terminal $T_{XCK}$ for the inverted signal of the clock signal CK, and the gate of the nMOS transistor 43 is connected to the input terminal $T_{CK}$ for the clock signal CK.

FIGS. 6A to 6E are operation timing charts of the level conversion circuit of the above configuration.

Below, an explanation will be made of the operation of this synchronous level conversion circuit referring to FIG. 5 and FIGS. 6A to 6E.

Note that, it is assumed that the clock signal CK is a clock signal having a high level of 3.3V, the same voltage as the power source voltage $V_{DD}$ of the second circuit 200. Further, it is assumed that the ground potential is 0V.

A clock signal CK alternating between a high level and a low level at a predetermined cycle is input to the input terminal $T_{CK}$, and an inverted signal XCK of the clock signal CK is input to the input terminal $T_{XCK}$.

When the clock signal CK is a low level, the pMOS transistor 12 and the nMOS transistor 13 become conductive. Then, when an input signal alternating between a high level and a low level is input to the input terminal $T_{IN}$, the pMOS transistor 11 or the nMOS transistor 14 becomes conductive, and the signal input to the input terminal $T_{IN}$ is inverted and appears at the node $ND_A$.

At the rising edge of the clock signal CK, the pMOS transistor 22 and the nMOS transistor 23 become conductive in state. Then, in accordance with the level of the node $ND_A$, the pMOS transistor 21 or the nMOS transistor 24 becomes conductive, and the signal of the node $ND_A$ is inverted and transferred to the node $ND_B$. Namely, at the rising edge of the clock signal CK, a signal having the same phase as that of the signal input to the input terminal $T_{IN}$ appears at the node $ND_B$.

More specifically, in a cycle 1, before the clock signal CK rises, in a state where the signal of a high level is input to the input terminal $T_{IN}$, the pMOS transistor 12 and the nMOS transistor 13 are conductive, the pMOS transistor 11 is nonconductive, and the nMOS transistor 14 is conductive, and therefore the node $ND_A$ is held at the low level. Namely, a signal having a phase that is inverse to the phase of the signal input to the input terminal $T_{IN}$ appears at the node $ND_A$.

Then, since the node $ND_A$ is at a low level, the pMOS transistor 21 becomes conductive, and the nMOS transistor 24 becomes nonconductive. Also, since the pMOS transistor 22 and the nMOS transistor 23 are nonconductive, the output impedance of the node $ND_B$ has reached the high state.

In such a state, when the clock signal CK rises, at the rising edge thereof, the pMOS transistor 12 and the nMOS transistor 13 are switched to the nonconductive state, and the node $ND_A$ reaches the high impedance state. Further, the pMOS transistor 22 and the nMOS transistor 23 are switched to the conductive state, and the potential of the node $ND_B$ is pulled up to the level of the power source voltage $V_{cc}$ via the pMOS transistor 21 and the pMOS transistor 22, which are conductive in state.

Namely, in the cycle 1, a high level signal is input to the input terminal $T_{IN}$, and at the rising edge of the clock signal CK, a signal having the same phase as that of the signal input to the input terminal $T_{IN}$ appears at the node $ND_B$.

During a period where the clock signal CK is held at the high level, the inverted signal XCK of the clock signal CK (hereinafter referred to as the clock signal XCK) is input to the gate of the nMOS transistor 30, therefore the nMOS transistor 30 is held in the nonconductive state, and the potential at the node $ND_B$ is not discharged and the high level thereof is held.

Further, a clock signal CK of a high level is input to the gate of the pMOS transistor 31, and the signal of a high level of the node $ND_B$ is supplied to the gate of the nMOS transistor 32, therefore the pMOS transistor 31 is held at a nonconductive state, the nMOS transistor 32 is held at a conductive state, the potential at the node $ND_C$ is discharged via the nMOS transistor 32 in the conductive state, and the potential is pulled down to the ground potential.

Then, during a period where the clock signal CK is held at the high level, the pMOS transistor 42 and the nMOS transistor 43 become conductive. Then, at this time, since the node $ND_C$ is at the low level, the pMOS transistor 41 becomes conductive, and the nMOS transistor 44 becomes nonconductive in state. As a result, the potential of the output terminal $T_{OUT}$ is pulled up to the level of the power source voltage $V_{DD}$ via the pMOS transistor 41 and the pMOS transistor 42.

Subsequently, from the falling edge of the clock signal CK, the clock signal XCK reaches the high level. As a result, a high level clock signal XCK is input to the gate of the pMOS transistor 22, and a clock signal CK of a low level is supplied to the gate of the nMOS transistor 23; therefore these transistors 22 and 23 become nonconductive. For this reason, during a period where the clock signal CK is held at a low level, the signal level thereof is not influenced by the level of node $ND_A$ or node $ND_B$. Further, from the falling edge of the clock signal CK, a high level clock signal XCK is supplied to the gate of the nMOS transistor 30, and the nMOS transistor 30 becomes conductive in state. As a result, irrespective of the state of the node $ND_B$ before this point, the potential at the node $ND_B$ is discharged via the nMOS transistor 30 in the conductive state, and the potential becomes the low level.

Then, a clock signal CK of a low level is input to the gate of the pMOS transistor 31, and the potential of a low level of the node $ND_B$ is supplied also to the gate of the nMOS transistor 32, therefore the pMOS transistor 31 becomes conductive, and the nMOS transistor 32 becomes nonconductive. For this reason, the potential at the node $ND_C$ is precharged via the pMOS transistor 31 in the conductive state, and the potential is pulled up to the level of the power source voltage $V_{DD}$.

Simultaneously with this, a high level signal of the clock signal XCK is supplied to the gate of the pMOS transistor 42, and a low level signal of the clock signal CK is supplied to the gate of the nMOS transistor 43; therefore these transistors become nonconductive, the potential of the output terminal $T_{OUT}$ is not influenced by the potential of the node $ND_C$, and the potential immediately before this is held as it is.

Above, the explanation was made of the operation of the level conversion circuit in a period of a cycle 1. Next, an explanation will be made of the operation of the same circuit in a cycle 2.

In the cycle 2, immediately before the rising edge of the clock signal CK, a signal of a low level is input to the input terminal $T_{IN}$, and during a period where the clock signal CK is held at the low level, the pMOS transistor 12 and the nMOS transistor 13 become conductive and further the pMOS transistor 11 becomes conductive; therefore the potential of the node $ND_A$ is pulled up to the power source voltage $V_{cc}$ via the pMOS transistor 11 and the pMOS transistor 12 in the conductive state. Namely, the signal of a low level input to the input terminal $T_{IN}$ is inverted and appears as a high level signal at the node $ND_A$.

Then, at the rising edge of the clock signal CK, the pMOS transistor 12 and the nMOS transistor 13 become nonconductive, the node $ND_A$ relates the high impedance state, the potential of the node $ND_A$ is not influenced by the potential of the input terminal $T_{IN}$, and the state immediately before this is held.

Further, a low level clock signal XCK is supplied to the gate of the pMOS transistor 22, and a high level clock signal CK is supplied to the gate of the nMOS transistor 23; therefore, these transistors become conductive. Further, the node $ND_A$ has reached the high level, therefore the pMOS transistor 21 becomes nonconductive, and the nMOS transistor 24 becomes conductive in state. As a result, the potential of the node $ND_B$ is pulled down to the ground potential via the nMOS transistor 23 and the nMOS transistor 24 in the conductive state.

In this way, at the rising edge of the clock signal CK, a signal having the same phase as that of the signal input to the input terminal $T_{IN}$ appears at the node $ND_B$.

At this time, a clock signal XCK of a low level is supplied to the gate of the nMOS transistor 30; therefore the nMOS transistor 30 becomes nonconductive, a low level potential of the node $ND_B$ is supplied to the gate of the nMOS transistor 32, and the nMOS transistor 32 becomes nonconductive.

Further, since a high level clock signal CK is supplied to the gate of the pMOS transistor 31, also the pMOS transistor 31 becomes nonconductive. As a result, the node $ND_C$ reaches an electrically floating state, i.e. high impedance, and the high level state immediately before this is held.

Then, during a period where the clock signal CK has a high level, the pMOS transistor 42 and the nMOS transistor 43 become conductive. Further since the node $ND_C$ is at a high level, the pMOS transistor 41 becomes nonconductive, and the nMOS transistor 44 becomes conductive. As a result, the potential of the output terminal $T_{OUT}$ is pulled down to the ground potential via the nMOS transistor 43 and the nMOS transistor 44 in the conductive state.

Subsequently, at the falling edge of the clock signal CK, in the first circuit 100, the pMOS transistor 22 and the nMOS transistor 23 are switched to the nonconductive state, and the potential of the node $ND_B$ is not influenced by the potential of the node $ND_A$. Further, a clock signal XCK of a high level is supplied to the gate of the nMOS transistor 30, therefore the nMOS transistor 30 becomes conductive, and the node $ND_B$ is held at the ground potential as it is.

Further, a clock signal CK which becomes the low level is supplied to the gate of the pMOS transistor 31, the pMOS transistor becomes conductive, and the potential of the node $ND_B$ of a low level is supplied to the gate of the nMOS transistor 32, therefore the nMOS transistor 32 becomes nonconductive, and thus the potential of the node $ND_C$ is held at the level of the power source voltage $V_{DD}$ via the pMOS transistor 31 in the conductive state.

Then, during a period where the clock signal CK is at a low level, the pMOS transistor 42 and the nMOS transistor 43 become nonconductive in state, so the potential of the output terminal $T_{OUT}$ is not influenced by the potential of the node $ND_C$ and is held at the potential of a low level immediately before this, that is, the ground potential.

FIGS. 7A to 7F are timing charts of a case where a deviation occurs between in the clock signal input to the first circuit 100 and the second circuit 200.

The clock signal $CK_0$ indicates a clock signal input to the first circuit 100, and the clock signal $CK_1$ indicates the clock signal input to the second circuit 200. As illustrated, the clock signal $CK_0$ input to the first circuit 100 is slightly behind the clock signal $CK_1$ input to the second circuit 200.

In the cycle 1, the clock signal $CK_0$ of the first circuit 100 is behind the clock signal $CK_1$ of the second circuit 200; therefore when the second circuit 200 starts operation, even if the first circuit 100 is going to output the previous state, the potential at the node $ND_B$ has been discharged by the previous cycle, thus the level conversion circuit does not erroneously operate.

The same is true in the cycle 2. Since the potential at the node $ND_B$ is discharged in the previous cycle, it has a similar potential to that of the signal of the first circuit 100, which is output with a time lag, and no malfunction occurs.

As mentioned above, irrespective of whether the level conversion circuit outputs a high level signal or a low level signal, even if there is a deviation of the clock signal CK such as a skew of the clock signal, no malfunction occurs due to this. The level conversion circuit converts the level of the signal input to the input terminal $T_{IN}$ and outputs a correct result to the output terminal $T_{OUT}$.

As mentioned above, due to the level conversion circuit shown in FIG. 5, a signal of, for example, 2.2V input to the input terminal $T_{IN}$ is converted to, for example, a 3.3V level signal and output to the output terminal $T_{OUT}$, so this level conversion circuit realizes level conversion between circuits with different power source voltages.

As explained above, according to the present embodiment, the signal input to the input terminal $T_{IN}$ is inverted and transferred to the node $ND_A$ only during a period where the clock signal CK is a low level and is also inverted and transferred to the node $ND_B$ only during a period where the clock signal CK is a high level, the node $ND_B$ is grounded via the nMOS transistor 30 having a gate connected to the input terminal $T_{XCK}$ of the clock signal XCK and further connected to the gate of the nMOS transistor 32, the drain of the pMOS transistor 31 having a gate connected to the input terminal $T_{CK}$ of the clock signal CK and the drain of the nMOS transistor 32 are connected, and the signal of the node $ND_C$ created by the connecting point thereof is inverted and transferred to the output terminal $T_{OUT}$ during a period where the clock signal CK has a high level, even in a case where there is a deviation in the clock signal such as a skew. Thus malfunction can be avoided and the design of the timing of the circuit can be easily carried out. Further, leakage current can be greatly reduced and the conversion of a signal level can be realized with a low power consumption. Further, since it is a precharge logic, the circuit operates even if the potential difference for conversion is very large.

Second Embodiment

Figure 8:
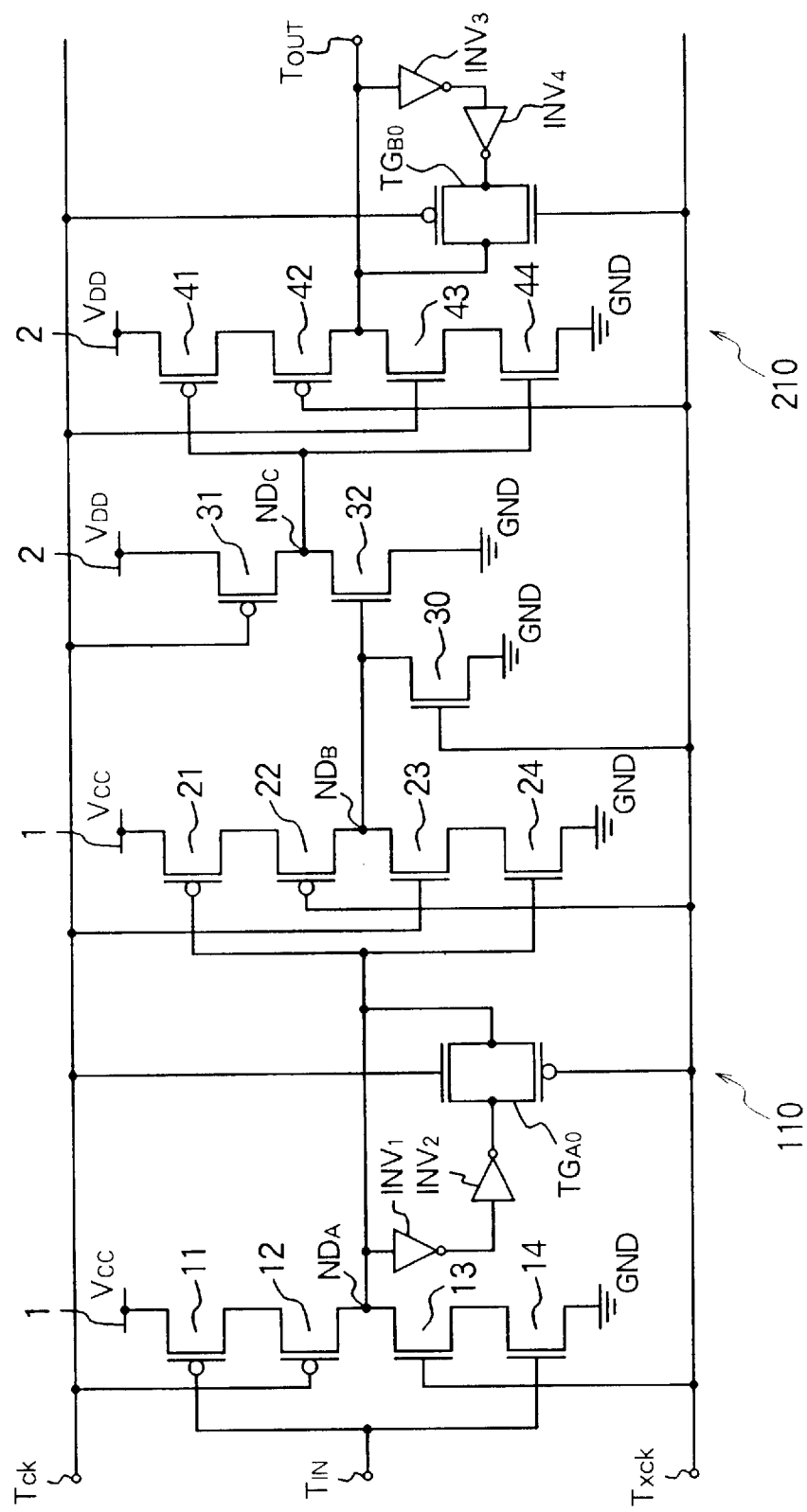
FIG. 8 is a circuit diagram of a second embodiment of the present invention.

FIG. 8 is a circuit diagram of a second embodiment of the level conversion circuit according to the present invention.

As shown in FIG. 8, the circuit of the present second embodiment is basically the same as the circuit of the first embodiment shown in FIG. 1, but in the first circuit 110, at a portion following the node $ND_A$, a latch circuit constructed by an inverter $INV_1$, an inverter $INV_2$, and a transfer gate $TG_{A0}$ is connected, and in a second circuit 210, at a preceding portion of the output terminal $T_{OUT}$, a latch circuit constructed by an inverter $INV_3$, an inverter $INV_4$, and a transfer gate $TG_{B0}$ is connected, respectively.

Note that, in the present embodiment, it is assumed that the inverter $INV_1$ and the inverter $INV_2$ are operated by the power source voltage $V_{cc}$, and the inverter $INV_3$ and the inverter $INV_4$ are operated by the power source voltage $V_{DD}$.

Figure 6:
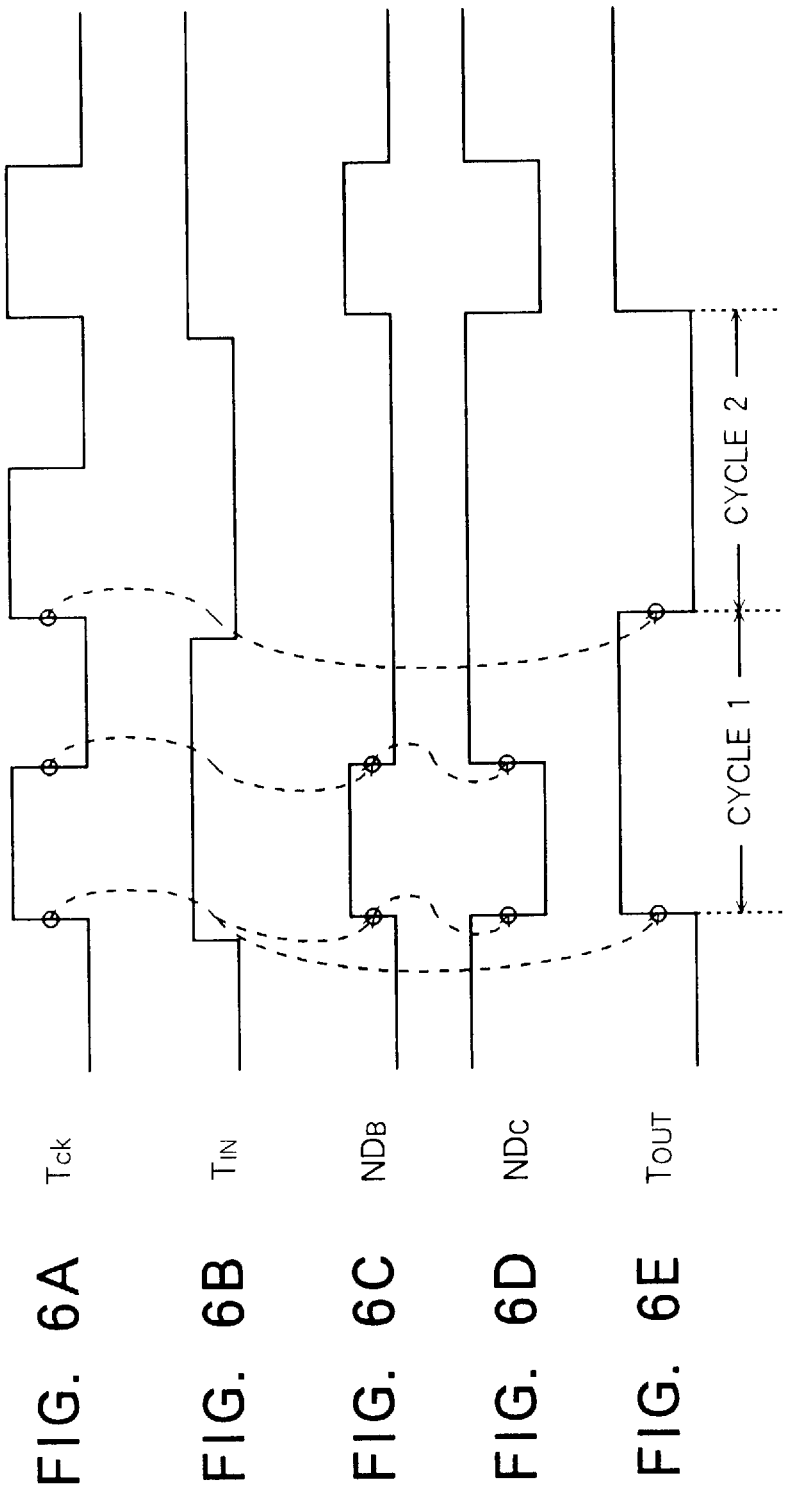
FIGS. 6A to 6E are timing charts of the operation of the level conversion circuit shown in FIG. 5.
Figure 7:
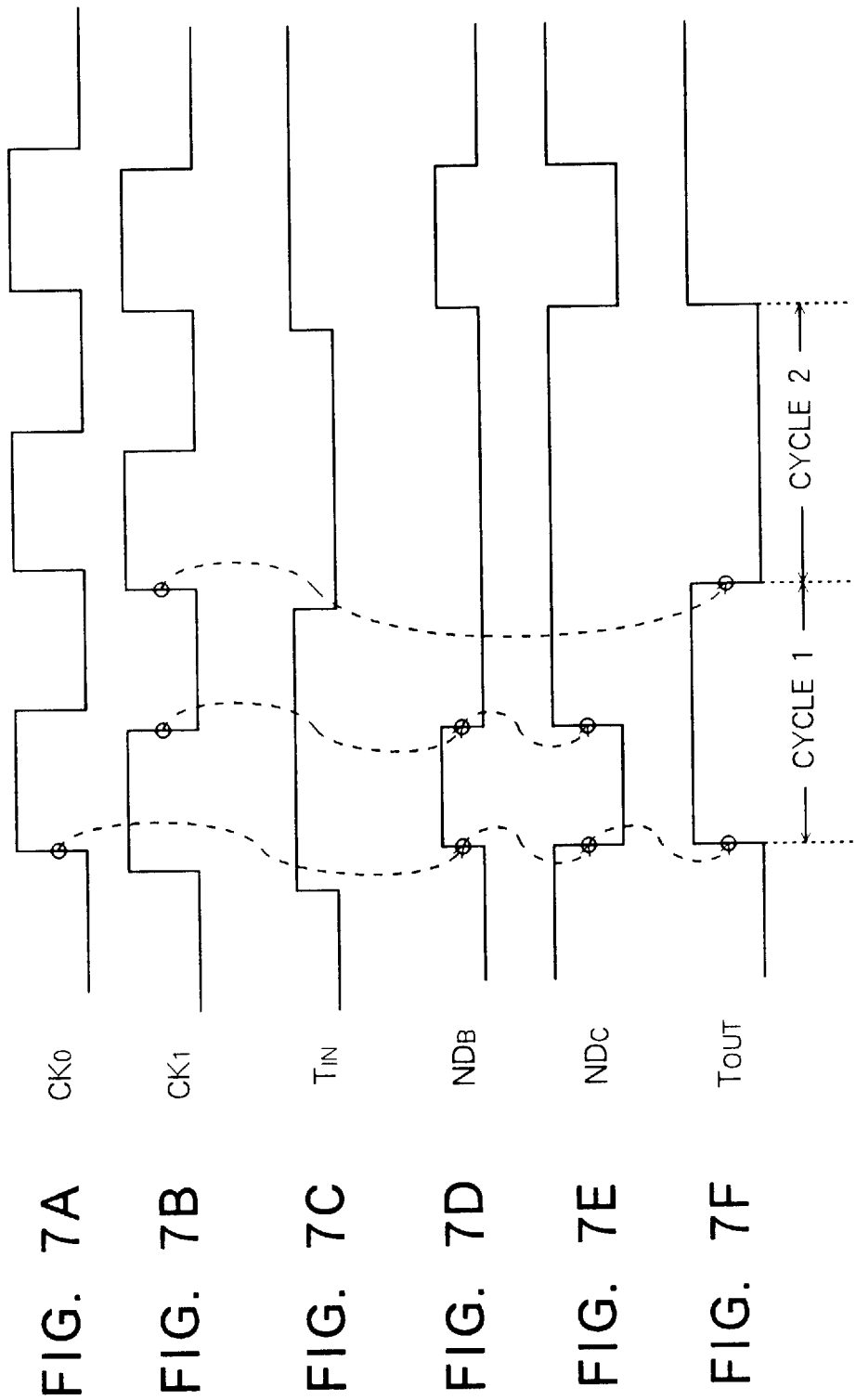
FIGS. 7A to 7F are timing charts of the operation of the level conversion circuit shown in FIG. 5 when a clock skew occurs.

Below, an explanation will be made of the operation of the level conversion circuit in the second embodiment in comparison with the first embodiment referring to FIG. 6.

The gate of the pMOS transistor in the transfer gate $TG_{A0}$ is connected to the input terminal $T_{XCK}$ of the clock signal XCK, and the gate of the nMOS transistor in the transfer gate $TG_{A0}$ is connected to the input terminal $T_{CK}$ of the clock signal CK.

The gate of the pMOS transistor in the transfer gate $TG_{B0}$ is connected to the input terminal $T_{CK}$ for the clock signal CK, and the gate of the nMOS transistor in the transfer gate $TG_{B0}$ is connected to the input terminal $T_{XCK}$ for the clock signal XCK.

In the above configuration, the transfer gate $TG_{A0}$ becomes conductive only during a period where the clock signal CK has a high level and the transfer gate $TG_{B0}$ becomes conductive only during a period where the clock signal CK is a low level.

In the first circuit 110, the inverter $INV_1$, the inverter $INV_2$, and the transfer gate $TG_{A0}$ are connected in series, the input terminal of the inverter $INV_1$ is connected to the node $ND_A$, the output terminal of the inverter $INV_1$ is connected to the input terminal of the inverter $INV_2$, and the output terminal of the inverter $INV_2$ is connected via the transfer gate $TG_{A0}$ to the node $ND_A$.

In the second circuit 210, the inverter $INV_3$, the inverter $INV_4$, and the transfer gate $TG_{B0}$ are connected in series, the input terminal of the inverter $INV_3$ is connected to the output terminal $T_{OUT}$, the output terminal of the inverter $INV_4$ is connected to the input terminal of the inverter $INV_4$, and the output terminal of the inverter $INV_4$ is connected via the transfer gate $TG_{B0}$ to the output terminal $T_{OUT}$.

In such a configuration, during a period where the clock signal CK is a low level, the pMOS transistor 12 and the nMOS transistor 13 become conductive. In accordance with the level of the signal input to the input terminal $T_{IN}$, the pMOS transistor 11 or the nMOS transistor 14 becomes conductive and the signal input to the input terminal $T_{IN}$ is inverted and transferred to the node $ND_A$. Further, in this case, the transfer gate $TG_{A0}$ becomes nonconductive, and the latch circuit created by the inverter $INV_1$ and the inverter $INV_2$ does not operate.

On the other hand, during a period where the clock signal CK is at a high level, the pMOS transistor 12 and the nMOS transistor 13 become nonconductive, and the node $ND_A$ reaches the high impedance state. Further, at this time, the pMOS transistor 22 and the nMOS transistor 23 become conductive, and in accordance with the potential of the node $ND_A$, the pMOS transistor 21 or the nMOS transistor 24 becomes conductive and the potential of the node $ND_A$ is inverted and transferred to the node $ND_B$.

In this case, the transfer gate $TG_{A0}$ becomes conductive in state, the latch circuit created by the inverter $INV_1$ and the inverter $INV_2$ operates, the node $ND_A$ becomes static (stable) in state, and the potential of the node $ND_A$ is held.

Further, in the second circuit 210, similar to the first circuit 110, the latch circuit created by the inverter $INV_3$ and the inverter $INV_4$ operates only during a period where the clock signal CK is a low level.

When the clock signal CK is a high level, the transfer gate $TG_{B0}$ becomes nonconductive, and the latch circuit created by the inverter $INV_3$ and the inverter $INV_4$ does not operate. In this case, the pMOS transistor 42 and the nMOS transistor 43 become conductive, and, in accordance with the potential of the node $ND_C$, the pMOS transistor 41 or the nMOS transistor 44 becomes conductive in state and the potential of the node $ND_C$ is inverted and transferred to the output terminal $T_{OUT}$.

On the other hand, when the clock signal CK is a low level, the transfer gate $TG_{B0}$ becomes conductive, the latch circuit constructed by the inverter $INV_3$ and the inverter $INV_4$ operates, and the potential of the output terminal $T_{OUT}$ is held. Namely, the output terminal $T_{OUT}$ becomes static (stable). Further, during a period where the clock signal CK is at a low level in this way, the pMOS transistor 42 and the nMOS transistor 43 become nonconductive, and the potential of the output terminal $T_{OUT}$ is not influenced by the potential of the node $ND_C$.

As explained above, according to the present second embodiment, the latch circuit constructed by the two series-connected inverters $INV_1$ and $INV_2$ and the transfer gate $TG_{A0}$ is connected to the node $ND_A$ of the first circuit 110, the transfer gate $TG_{A0}$ becomes conductive only when the clock signal CK is at a high level, and the potential of the node $ND_A$ is held when the transfer gate $TG_{A0}$ is conductive. Further, in the second circuit 210, similar to that described above, the latch circuit constructed by the series-connected inverter $INV_3$ and inverter $INV_4$ and the transfer gate $TG_{A0}$ is connected to the output terminal $T_{OUT}$, the transfer gate $TG_{B0}$ becomes conductive only when the clock signal CK is at a low level, and the potential of the output terminal $T_{OUT}$ is held. Therefore regardless of whether the clock signal CK is at a high level or low level when the circuit is in reset reset state, in the first circuit 110 and the second circuit 210, the power consumption in the standby state can be reduced by suppressing the generation of a node which is at the high impedance state.

Third Embodiment

Figure 9:
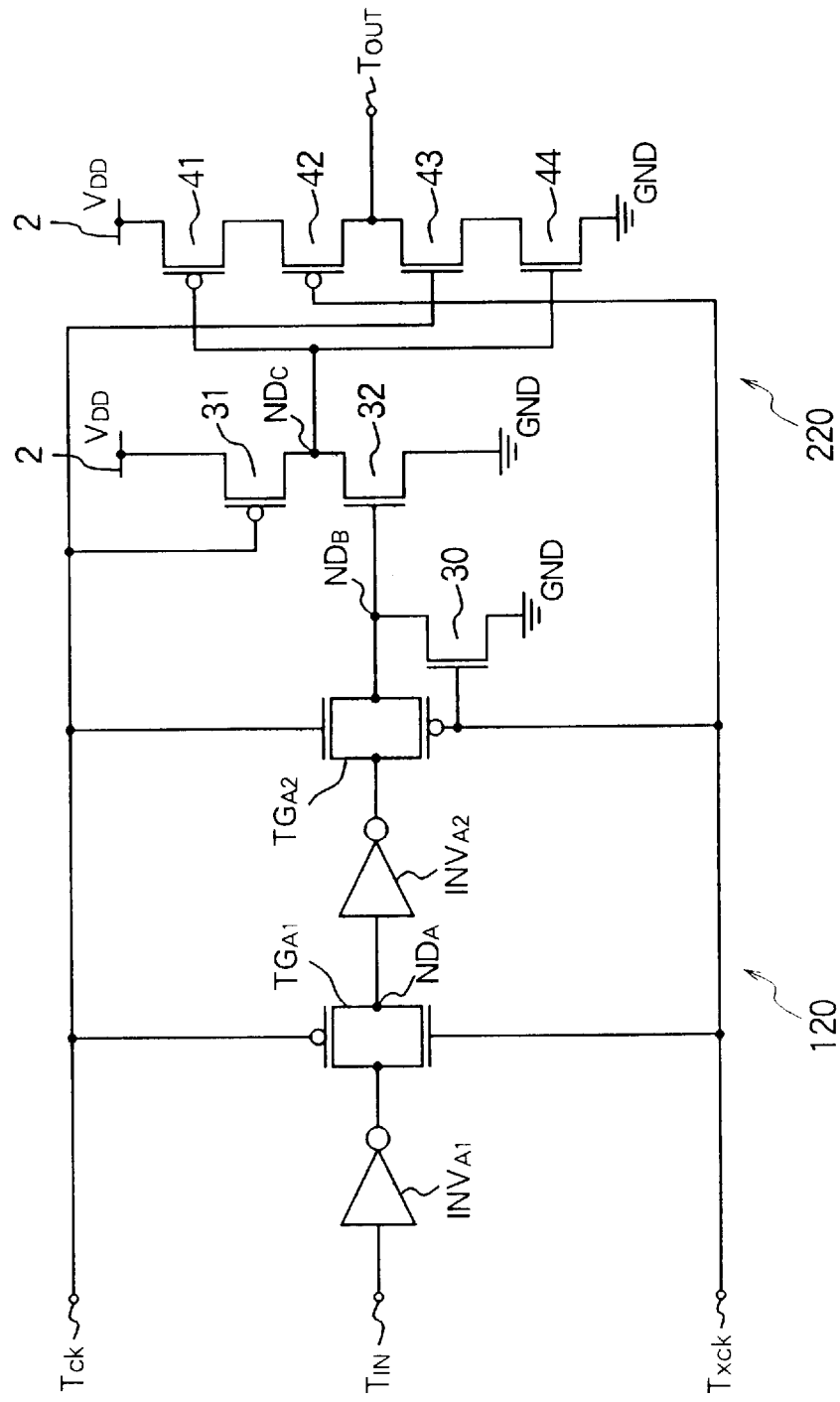
FIG. 9 is a circuit diagram of a third embodiment of the present invention.

FIG. 9 is a circuit diagram of a third embodiment of the level conversion circuit according to the present invention.

As shown in FIG. 9, in the circuit of the third embodiment, the portion from the node $ND_B$ to the output terminal $T_{OUT}$ is similar to that of the circuit of the first embodiment shown in FIG. 5. The explanation of the configuration and operation of this portion will therefore be omitted. Below, the explanation will be made of only the configuration and operation of the first circuit 120.

In the first circuit 120, between the input terminal $T_{IN}$ and the node $ND_B$, an inverter $INV_{A1}$, a transfer gate $TG_{A1}$, an inverter $INV_{A2}$, and a transfer gate $TG_{A2}$ are connected in series.

Note that, here, it is assumed that the inverter $INV_{A1}$ and the inverter $INV_{A2}$ operate by the power source voltage $V_{cc}$.

The transfer gate $TG_{A1}$ is constructed by a pMOS transistor with a gate connected to the input terminal $T_{CK}$ of the clock signal CK and an nMOS transistor with a gate connected to the input terminal $T_{XCK}$ for the clock signal XCK, while the transfer gate $TG_{A2}$ is constructed by a pMOS transistor with a gate connected to the input terminal $T_{XCK}$ for the clock signal XCK and an nMOS transistor with a gate connected to the input terminal $T_{CK}$ for the clock signal CK.

In such a configuration, the transfer gate $TG_{A1}$ becomes conductive only when the clock signal CK is at a low level, and the transfer gate $TG_{A2}$ becomes conductive only when the clock signal CK is at a high level.

When the clock signal CK is at a low level, the transfer gate $TG_{A1}$ becomes conductive and the signal input to the input terminal $T_{IN}$ is inverted via the inverter $INV_{A1}$ and output to the input terminal of the inverter $INV_{A2}$. When the clock signal CK reaches the high level, the transfer gate $TG_{A1}$ becomes nonconductive and the transfer gate $TG_{A2}$ becomes conductive, therefore the signal input to the input terminal of the inverter $INV_{A2}$ is inverted via the inverter $INV_{A2}$ and further output to the node $ND_B$ via the transfer gate $TG_{A2}$.

Namely, at the rising edge of the clock signal CK, the signal input to the input terminal $T_{IN}$ is output to the node $ND_B$.

Since the configuration of the circuit from the node $ND_B$ to the output terminal $T_{OUT}$ is similar to that of the circuit of the first embodiment of the present invention shown in FIG. 5, the explanation for this will be omitted.

As explained above, in the present invention, the configuration of the circuit is not limited to just a flip-flop circuit. Any other circuit can also be used as long as it can prohibit the transfer of a signal by the clock signal CK.

Fourth Embodiment

Figure 10:
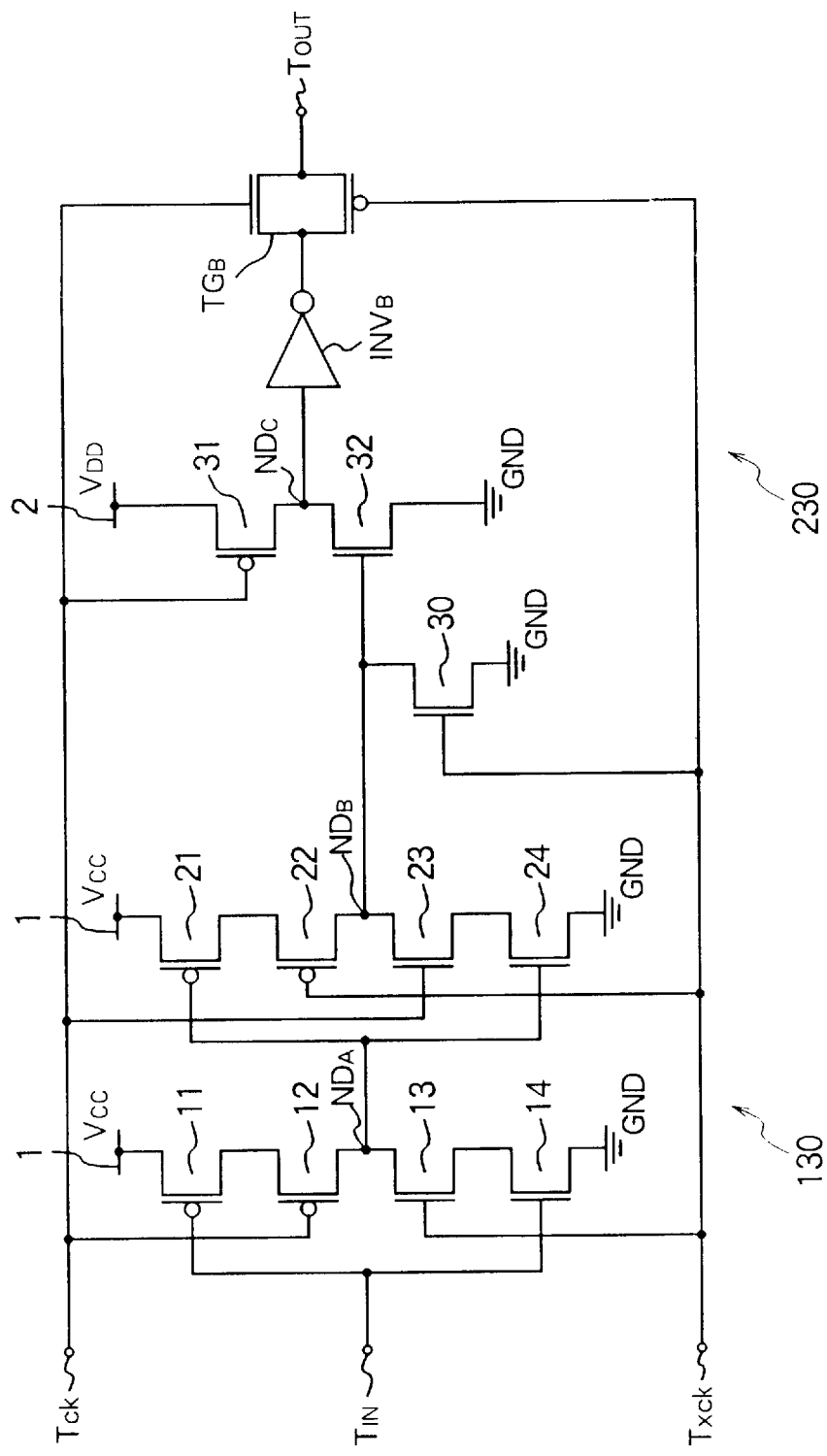
FIG. 10 is a circuit diagram of a fourth embodiment of the present invention.

FIG. 10 is a circuit diagram of a fourth embodiment of the level conversion circuit according to the present invention.

As shown in FIG. 10, in the circuit of the fourth embodiment, the configuration of the first circuit 130 from the input terminal $T_{IN}$ to the node $ND_B$ is similar to that of the circuit of the first embodiment shown in FIG. 5, therefore the explanation of the configuration and operation of this portion will be omitted. Below, the explanation will be made of only the configuration and operation of the second circuit 230 different from the first embodiment shown in FIG. 5.

As shown in FIG. 10, in the second circuit 230, between the node $ND_C$ and the output terminal $T_{OUT}$, the inverter $INV_B$ and the transfer gate $TG_B$ are connected in series.

Note that, here, it is assumed that the inverter $INV_B$ operates by the power source voltage $V_{DD}$.

The input terminal of the inverter $INV_B$ is connected to the node $ND_C$, and the output terminal of the inverter $INV_B$ is connected to the output terminal $T_{OUT}$ via the transfer gate $TG_B$.

Further, the transfer gate $TG_B$ is constructed by an nMOS transistor with a gate connected to the input terminal $T_{CK}$ for the clock signal CK and a pMOS transistor with a gate connected to the input terminal $T_{XCK}$ for the clock signal XCK.

In such a configuration, the transfer gate $TG_B$ becomes conductive in state and the signal of the node $ND_C$ is output to the output terminal $T_{OUT}$ only when the clock signal CK reaches a high level.

In the second circuit 230, when the clock signal CK has a high level, a ground potential is supplied to the gate of the nMOS transistor 30, the nMOS transistor 30 becomes nonconductive, and a potential of a high level is supplied to the gate of the pMOS transistor 31; therefore the pMOS transistor 31 also becomes nonconductive in state and the potential of the node $ND_C$ is set by the potential of the node $ND_B$ input to the gate of the nMOS transistor 32.

For example, when the node $ND_B$ is a high level, the nMOS transistor 32 becomes conductive, the potential at the node $ND_C$ is discharged via the nMOS transistor 32 in the conductive state, and the potential is pulled down to the ground potential. The low level potential of the node $ND_C$ is inverted via the inverter $INV_B$ and the transfer gate $TG_B$ in the conductive state, and the resultant signal is output to the output terminal $T_{OUT}$ as a high level signal.

Further, when the node $ND_B$ is at a low level, the nMOS transistor 32 becomes nonconductive, the potential at the node $ND_C$ is not discharged, and the high level state immediately before this is held. The high level potential of the node $ND_C$ is inverted via the inverter $INV_B$ and the transfer gate $TG_B$ in the conductive state and becomes a low level and output to the output terminal $T_{OUT}$.

When the clock signal CK is a low level, also the nMOS transistor 30 becomes conductive, and the potential of the node $ND_B$ is pulled down to the ground potential via the nMOS transistor 30 in the conductive state. Namely, the low level potential is supplied to the gate of the nMOS transistor 32. Further, since the pMOS transistor 31 becomes conductive, the potential of the node $ND_C$ is pulled up to the power source voltage $V_{DD}$ level via the pMOS transistor 31 in the conductive state.

On the other hand, when the clock signal CK is held at a low level, the transfer gate $TG_B$ becomes nonconductive, and accordingly the potential of the output terminal $T_{OUT}$ is not influenced by the potential of the node $ND_C$ and the state immediately before this is held.

As explained above, according to the present fourth embodiment, the inverter $INV_B$ and the transfer gate $TG_B$, which becomes conductive only when the clock signal CK is at a high level, are connected in series between the node ND$_C$ and the output terminal T$_{OUT}$, and the potential of the node ND$_C$ is inverted, held, and output to the output terminal T$_{OUT}$.

That is, the configuration of the second circuit 230 is not limited to just a flip-flop circuit. Any other circuit can also be used so long as it can hold the output signal by the clock signal CK.

What is claimed is:

1. A level conversion circuit receiving a clock signal to control timing, comprising:

a first circuit having a first clock input terminal, a signal input terminal and a first output node, wherein the first clock input terminal receives the clock signal, the signal input terminal receives a first input signal that alternates between a first power potential level and a reference potential level, and the first output terminal outputs a first output signal that changes between the first power potential level and the reference potential level, and wherein the first output node periodically reaches a high impedance state responsive to the clock signal;

a second circuit coupled to the first output node for receiving the first output signal from the first circuit, the second circuit having a second clock input terminal for receiving the clock signal;

a second output node for outputting a second output signal that changes between a second power potential level and the reference potential level responsive to the first output signal, and an output circuit coupled to the second output node for outputting a converted output signal at said second output node that changes between the second power potential level and the reference potential level, wherein said converted circuit signal changes in response to a level of the first output signal and the clock signal; and a third circuit coupled to the first output node and the clock signal for setting the first output node at a first predetermined potential level when the first output node is in the high impedance state.

2. The level conversion circuit set forth in claim 1, wherein the second output signal output by the second circuit is at a second predetermined potential level when the first output node is in the high impedance state.

3. The level conversion circuit set forth in claim 1, wherein the first predetermined potential level set by the third circuit is the reference potential level.

4. The level conversion circuit set forth in claim 1, wherein the first circuit comprises a first latch circuit and the second circuit comprises a second latch circuit, and one of said first and second latch circuits is conductive when the other of said first and second latch circuits is not conductive.

5. The level conversion circuit as set forth in claim 1, wherein the second circuit has a level setting circuit for outputting of said second output signal at the reference potential level when the first output signal at the first output node is at the reference potential level, and for outputting of said second signal at said second power potential level when the first output signal is at the first potential level.

6. The level conversion circuit set forth in claim 5, wherein the level setting circuit in the second circuit has a load transistor driven by the clock signal and a driving transistor connected in series between the second power potential and the reference potential, and the gate of the driving transistor is connected to the first output node of the first circuit.

7. The level conversion circuit set forth in claim 1, wherein the second circuit outputs the reference potential level when the first output node is at the reference potential level and outputs the second power potential level when the first output node is at the first power potential level.

* * * * *